United States Patent
Lee et al.

(10) Patent No.: US 8,456,246 B2
(45) Date of Patent: Jun. 4, 2013

(54) QUADRATURE VOLTAGE-CONTROLLED OSCILLATOR AND METHOD OF PROVIDING FOUR-PHASE OUTPUT SIGNALS

(75) Inventors: Shuenn-Yuh Lee, Chia-Yi County (TW); Liang-Hung Wang, Tainan (TW); Yu-Heng Lin, Chia-Yi County (TW)

(73) Assignee: National Chung Cheng University, Chia-Yi (TW)

(*) Notice: Subject to any disclaimer, the term of this patent is extended or adjusted under 35 U.S.C. 154(b) by 129 days.

(21) Appl. No.: 13/152,793

(22) Filed: Jun. 3, 2011

(65) Prior Publication Data

US 2012/0182078 A1    Jul. 19, 2012

(30) Foreign Application Priority Data

Jan. 18, 2011 (TW) .............................. 100101812 A

(51) Int. Cl.
*H03B 5/12* (2006.01)
*H03B 27/00* (2006.01)
*H03C 3/20* (2006.01)

(52) U.S. Cl.
USPC ................... 331/50; 331/45; 331/47; 331/48; 331/53; 331/76; 331/117 FE; 331/172; 331/177 V

(58) Field of Classification Search
USPC ............... 331/45–50, 53, 55, 56, 76, 117 FE, 331/117 R, 167, 172, 177 V
See application file for complete search history.

(56) References Cited

U.S. PATENT DOCUMENTS

| | | | |
|---|---|---|---|
| 5,912,596 A * | 6/1999 | Ghoshal ..................... 331/117 R |
| 6,850,122 B2 * | 2/2005 | Ravi et al. ........................ 331/46 |
| 7,026,880 B2 * | 4/2006 | Shi et al. .......................... 331/50 |
| 7,847,650 B2 * | 12/2010 | Yao et al. ....................... 331/167 |
| 7,911,281 B2 * | 3/2011 | Hoshino et al. .................. 331/16 |
| 8,258,879 B2 * | 9/2012 | Lu et al. ............................. 331/2 |
| 8,264,288 B2 * | 9/2012 | Lin et al. ................. 331/107 SL |
| 2010/0233976 A1 * | 9/2010 | Hoshino et al. ............... 455/119 |

* cited by examiner

*Primary Examiner* — Levi Gannon
(74) *Attorney, Agent, or Firm* — Muncy, Geissler, Olds & Lowe, PLLC

(57) ABSTRACT

A quadrature VCO includes a first oscillator unit and a second oscillator unit. Each of the first and second oscillator unit is composed of a DC bias source, a complementary cross-coupled pair, an LC resonator unit, a frequency-doubling sub-harmonic coupler unit, and a ground terminal. When the LC resonator units of the first and second oscillator units are operated, four signals of different phases can be outputted via the output terminals. In this way, the output phase difference of the two oscillator units can keep 180 degrees and allow the two oscillator units to mutually inject signals to generate quadrature output signals.

6 Claims, 7 Drawing Sheets

QUADRATURE VOLTAGE-CONTROLLED OSCILLATOR AND METHOD OF PROVIDING FOUR-PHASE OUTPUT SIGNALS

BACKGROUND OF THE INVENTION

1. Field of the Invention

The present invention relates generally to a voltage-controlled oscillator (VCO), and more particularly, to a quadrature VCO and a method of providing quadrature output signals.

2. Description of the Related Art

A VCO has been indispensable in the operations of fully integrated wireless receiver architectures including superheterodyne, direct-conversion, and low-IF (intermediate frequency). The functionality of purposed VCO is to provide a signal mixed with the RF (radio frequency) signals and to downconvert the RF signal into an intermediate frequency via a mixer. To eliminate an image frequency, a quadrature-conversion method is usually adopted for mixing the RF signal via I/Q quadrature paths to result in two inverse spectrums to achieve the goal of image frequency elimination. A local oscillation signal is also provided by the VCO, and moreover, the output signal is injected into a quadrature signal generator to induce a quadrature-phase output. Furthermore, it will not be any quadrature signal generator as the VCO can output the I/Q quadrature signals, and simultaneously, the advantage is to reduce both the chip area and cost effectively. Generally, a quadrature VCO does not have outstanding performance in phase noise and power consumption, and several conventional QVCOs with different coupling mechanism have been presented as below. As shown in FIG. 4 showing the first conventional architecture, a quadrature VCO is composed of two resonator units 30, each of which includes two NMOSs (N-channel metal oxide semiconductor). Each of the NMOSs of one of the resonator 30 is a cross-coupled pair 31 and those of the other resonator 30 are coupled transistors 33. An LC (inductor-capacitor) resonator unit 35 is connected in parallel with the cross-coupled pair 31 to constitute an oscillator that can keep oscillation. However, each of the resonator units 30 needs two different constant current sources 36 and 37 to reach the minimum bias current and enable the oscillator to start oscillation, so the power consumption is increased. The phase noises of the resonator units are also inverse proportion of the bias current, so the smaller the bias current is, the higher the noise will be, thus deteriorating the circuit performance. In addition, the coupled transistors 33 in parallel can also generate noises for the output terminal to make the phase noise increased.

As shown in FIG. 5 showing a second conventional architecture, another quadrature VCO is constituted by superimposition of a coupled transistor 43 and a cross-coupled pair. The advantage is to reduce the noise generated by the coupled transistor 43 for the output terminal, and that the structure of the quadrature VCO has less phase noise than previous. Additionally, the superimposition allows the bias current to be reused to decrease the power consumption where the structure of quadrature VCO is called top-series. However, the drawback is that the noise is still high.

As shown in FIG. 6 showing third conventional architecture, another quadrature VCO is also constituted by superimposition of a coupled transistor 53 and a cross-coupled pair 51, which is similar to the superimposition of the VCO of the second architecture as long as the coupled transistor is exchanged with the cross-coupled pair. In this way, the noise generated by the transistors of the cross-coupled pair 51 for the output terminal can be reduced, and the structure of quadrature VCO is called bottom-series. The advantage of this conventional quadrature VCO has lower phase noise, but it has induced the higher phase error.

To sum up, the phase error of the top series is superior to that of the bottom series, but the phase noise of the bottom series is superior to that of the top series.

As shown in FIG. 7 showing a fourth conventional architecture, another quadrature VCO is to generate quadrature output signals by common-mode inductive coupling. The transformer base is used to couple the output signals; however, the phase difference of two oscillators keeps set at 180 degree by second harmonic mechanism. The drawback of this structure is using the transformer component will increase the chip area and chip cost, so the quadrature signals are generated, thus increasing the chip area to heighten the cost.

SUMMARY OF THE INVENTION

The primary objective of the present invention is to provide a quadrature VCO at which the difference of output phase of two oscillator units can keep at 180 degrees and these two oscillator units are mutually injected with each other to induce quadrature output signals.

The secondary objective of the present invention is to provide a quadrature VCO, which can remove constant current source to decrease the influence of low-frequency noise on phase noise.

The foregoing objectives of the present invention are attained by the quadrature VCO, which comprises a first oscillator unit and a second oscillator unit. Each of the first and second oscillator unit is composed of a direct-current (DC) bias source, a complementary cross-coupled pair, an LC resonator unit, a frequency-doubling sub-harmonic coupler unit, and a ground terminal. The LC resonator unit of the first oscillator unit includes two signal output terminals. The frequency-doubling sub-harmonic coupler unit of the first oscillator unit is connected with the two output terminals and further includes two output terminals coupled with the complementary cross-coupled pair of the second oscillator unit. The LC resonator unit of the second oscillator unit includes two signal output terminals. The frequency-doubling sub-harmonic coupler unit of the second oscillator unit is connected with the two output terminals and further includes two output terminals coupled with the complementary cross-coupled pair of the first oscillator unit. The LC resonator units of the first and second oscillator units can output four signals of different phases via the output terminals in operation.

As indicted from the above, the present invention provides a new solution replacing the transformer to the drawback of the common mode inductive coupling and can keep the phase difference of the second harmonic signals of the two oscillator units at 180 degrees. Subject to the concept of the injection-lock oscillator, the frequency-double signals can be injected into the VCO to generate four-phase signals and remove constant current source to decrease the influence of low-frequency noise on phase noise.

Based on the foresaid quadrature VCO, a method of providing quadrature outputs includes the steps of defining the two output signals of the first oscillator unit as $\theta$ and $\theta+\pi$, wherein the difference between the two output signals is 180 degrees and defining the two output signals of the second oscillator unit as $\phi$ and $\phi+\pi$, wherein the difference between the two output signals is 180 degrees; and getting the two output signals $\theta$ and $\theta+\pi$ of the first oscillator unit and the two output signals $\phi$ and $\phi+\pi$ of the second oscillator unit, while the LC resonator unit of the first oscillator unit generates a signal and then the signal is outputted through the corresponding two signal output terminals, passes through the frequency-doubling sub-harmonic coupler unit of the first oscillator unit, enters the complementary cross-coupled pair of the second oscillator unit via the two output terminals of the frequency-doubling sub-harmonic coupler unit, and finally injected into the LC resonator unit of the second oscillator unit, wherein the difference between the four signals is $\pi/4$; getting the two output signals $\phi$ and $\phi+\pi$ of the second oscillator unit and the two output signals $\theta$ and $\theta+\pi$ of the first oscillator unit, when the LC resonator unit of the second oscillator unit generates a signal and the signal is outputted through the corresponding two output terminals, passes through the frequency-doubling sub-harmonic coupler unit of the second oscillator unit, enters the complementary cross-coupled pair of the first oscillator unit, and further injected into the LC resonator of the first oscillator unit, wherein the difference between the four signals is $\pi/4$.

DETAILED DESCRIPTION OF PREFERRED EMBODIMENTS

Figure 1:
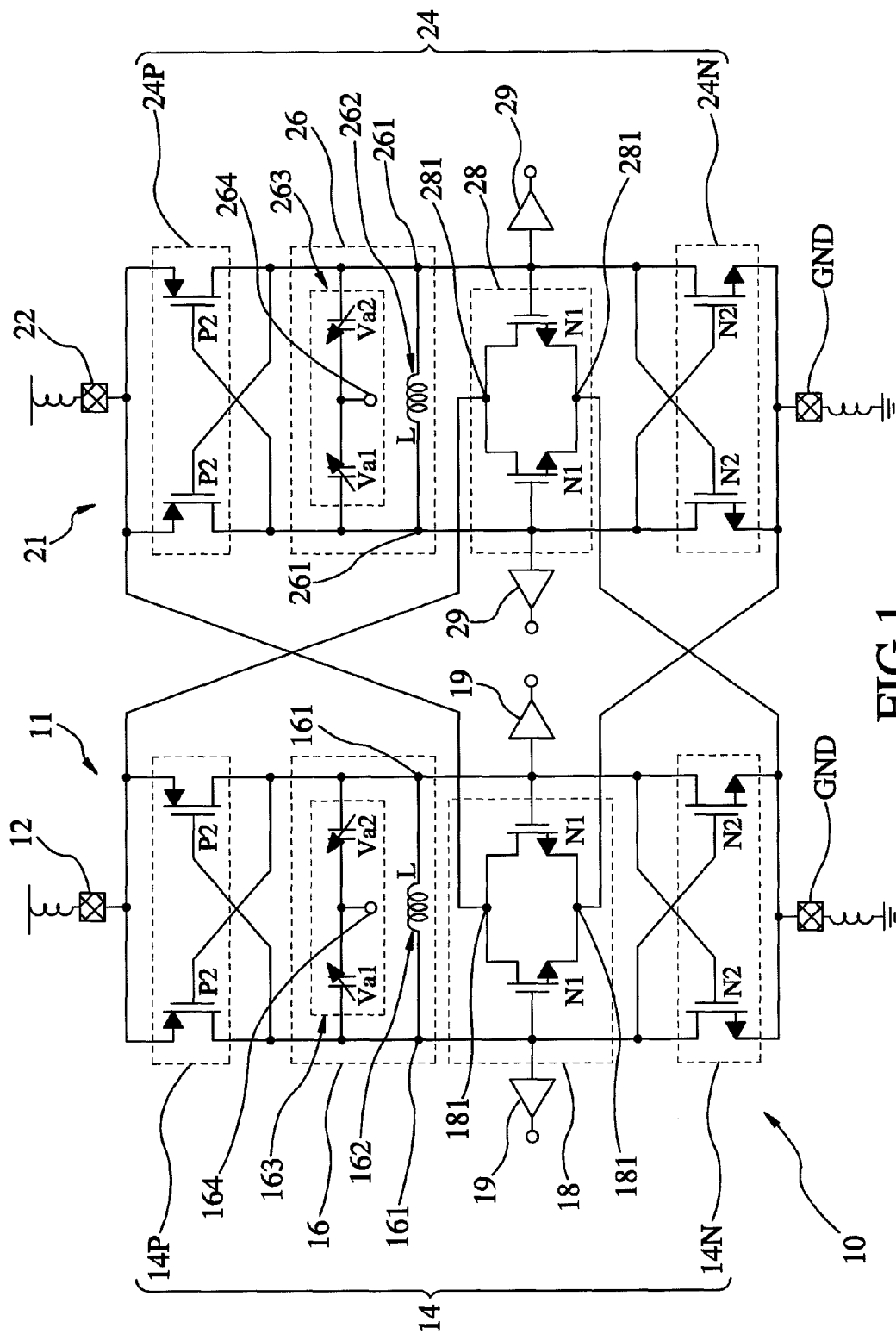
FIG. 1 is a circuit diagram of a preferred embodiment of the present invention.

Referring to FIG. 1, a quadrature VCO 10 constructed according to a preferred embodiment of the present invention is comprised of a first oscillator unit 11 and a second oscillator 21. The detailed descriptions and operations of these elements as well as their interrelations are recited in the respective paragraphs as follows.

The first oscillator unit 11 is composed of a DC bias source 12, a complementary cross-coupled pair 14, an LC resonator unit 16, a frequency-doubling sub-harmonic coupler unit 18, and a ground terminal GND.

The second oscillator unit 21 is also composed of a DC bias source 22, a complementary cross-coupled pair 24, an LC resonator unit 26, a frequency-doubling sub-harmonic coupler unit 28, and a ground terminal GND.

The LC resonator unit 16 of the first oscillator unit 11 includes two output terminals 161. The frequency-doubling sub-harmonic coupler unit 18 of the first oscillator unit 11 is connected with the two signal output terminals 161 and further includes two output terminals 181 coupled with the complementary cross-coupled pair 24 of the second oscillator unit 21. The LC resonator unit 26 of the second oscillator unit 21 also includes two output terminals 261. The frequency-doubling sub-harmonic coupler unit 28 of the second oscillator unit 21 is also connected with the two output terminals 261 and further includes two output terminals 281 coupled with the complementary cross-coupled pair 14 of the first oscillator unit 11.

Each of the frequency-doubling sub-harmonic coupler units 18 and 28 of the first and second oscillator units 11 and 21 is composed of two N-type transistors N1. As far as the frequency-doubling sub-harmonic coupler unit 18 is concerned, gate nodes of the N-type transistors N1 are coupled with the corresponding one of the signal output terminals 161 and 261 of the first and second oscillator unit 11 and 21. The phase difference between the output signals of the two signal output terminals 161 of the first oscillator unit 11 is 180 degrees. The phase difference between the output signals of the two signal output terminals 261 of the second oscillator unit 21 is also 180 degrees. Drain nodes of the N-type transistors N1 of the frequency-doubling sub-harmonic coupler unit 18 of the first oscillator unit 11 are connected with each other to become one of the output terminals 181 coupled with the DC bias source 22 of the second oscillator unit 21. Source nodes of the N-type transistors N1 of the frequency-doubling sub-harmonic coupler unit 18 of the first oscillator unit 11 are connected with each other to become the other output terminal 181 coupled with the ground terminal GND of the second oscillator unit 21. Drain nodes of the two N-type transistors N1 of the frequency-doubling sub-harmonic coupler unit 28 of the second oscillator unit 21 are connected with each other to become one of the output terminals 281 coupled with the DC bias source 12 of the first oscillator unit 11. Source nodes of the N-type transistors N1 of the frequency-doubling sub-harmonic coupler unit 28 of the second oscillator unit 21 are connected with each other to become the other output terminal 281 coupled with the ground terminal GND of the first oscillator unit 11.

Each of the complementary cross-coupled pairs 14 and 24 of the first and second oscillator units 11 and 21 is composed of an N-type transistor cross-coupled pair 14N(24N) and a P-type transistor cross-coupled pair 14P(24P). Each of the N-type transistor cross-coupled pairs 14N and 24N is comprised of two N-type transistors N2, one of which is the first N-type transistor N2 and the other is the second N-type transistor N2. A gate node of the first N-type transistor N2 is coupled with a drain node of the second N-type transistor N2. A gate node of the second N-type transistor N2 is coupled with a drain node of the first N-type transistor N2. Drain nodes of the two N-type transistors N2 are coupled with gate nodes of the two N-type transistors N1 of the frequency-doubling sub-harmonic coupler unit 18 or 28 of corresponding one of the first and second oscillator units 11 and 21. Source nodes of the two N-type transistors N2 are coupled with the ground terminal GND of corresponding one of the first and second oscillator units 11 and 21. Besides, each of the P-type transistor cross-coupled pairs 14P and 24P is composed of two P-type transistors P2, one of which is the first P-type transistor P2 and the other is the second P-type transistor. A gate node of the first P-type transistor P2 is coupled with a drain node of the second P-type transistor P2. A gate node of the second P-type transistor P2 is coupled with a drain node of the first P-type transistor P2. Drain nodes of the two P-type transistors P2 are coupled with gate nodes of the two N-type transistors N1 of the frequency-doubling sub-harmonic coupler unit 18 or 28 of corresponding one of the first and second oscillator units 11 and 21. Source nodes of the two P-type transistors P2 are coupled with the DC bias source 12 or 22 of corresponding one of the first and second oscillator units 11 and 21.

Each of the LC resonators 16 and 26 of the first and second oscillator units 11 and 21 of includes an inductor module 162(262) and a capacitor module 163(263). Each of the inductor modules 162 and 262 is composed of an inductor L having two ends connected with drain nodes of the two P-type transistors P2 of the P-type transistor cross-coupled pairs 14P and 24P of corresponding one of the first and second oscillator units 11 and 21. Besides, each of the capacitor units 163 and 263 is composed of two varactor diodes Va1 and Va2, whose negative electrodes are coupled with drain nodes of the two P-type transistors P2 of the P-type transistor cross-coupled pair 14P or 24P of the corresponding one of the first and second oscillator units 11 and 21 and whose positive electrodes are coupled with one of voltage-controlled power terminals 164 and 264, which are adapted for externally controllably changing the capacitance of the capacitor modules 163 and 263. Because the voltage-controlled power terminals 164 and 264 belong to the prior art, detailed description of how they work is skipped.

When the LC resonators 16 and 26 of the first and second oscillator units 11 and 21 are operated, signals are outputted through the signal output terminals 161 and 261 to become quadrature signals of different phases. The phase difference between the output signals of the two signal output terminals 161 of the first oscillator 11 is 180 degrees. The phase difference between the output signals of the two signal output terminals 261 of the second oscillator 21 is also 180 degrees. The phase difference between the output signal of one of the signal output terminal 161 of the first oscillator unit 11 and the output signals of the two signal output terminals 261 of the second oscillator unit 21 is 90 degrees. Thus, the phases of four output signals are quadrature signals of 0°, 90°, 180°, and 270°.

Figure 2:
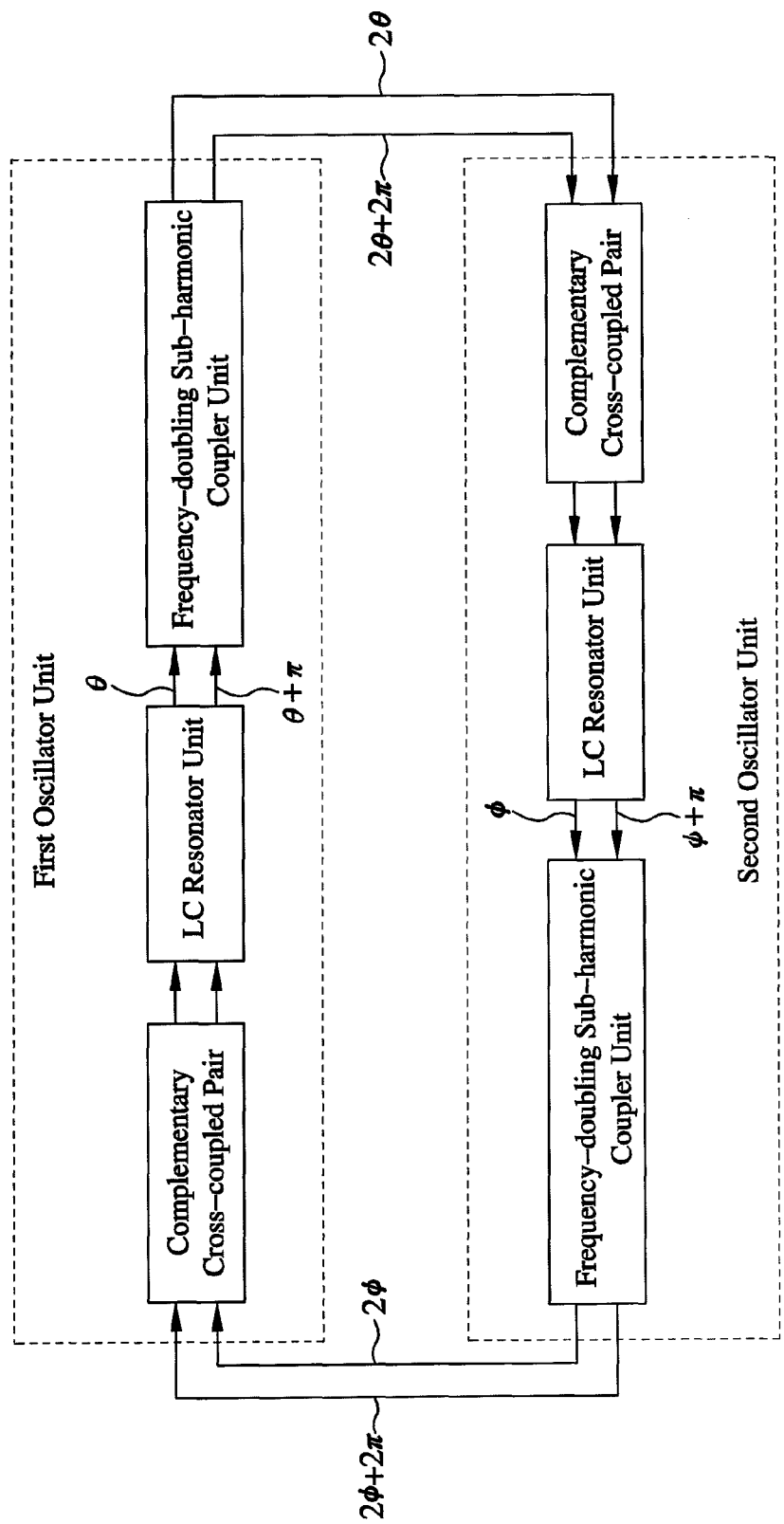
FIG. 2 is a flow chart of the preferred embodiment of the present invention, illustrating the state of the signal in oscillation.
Figure 3:
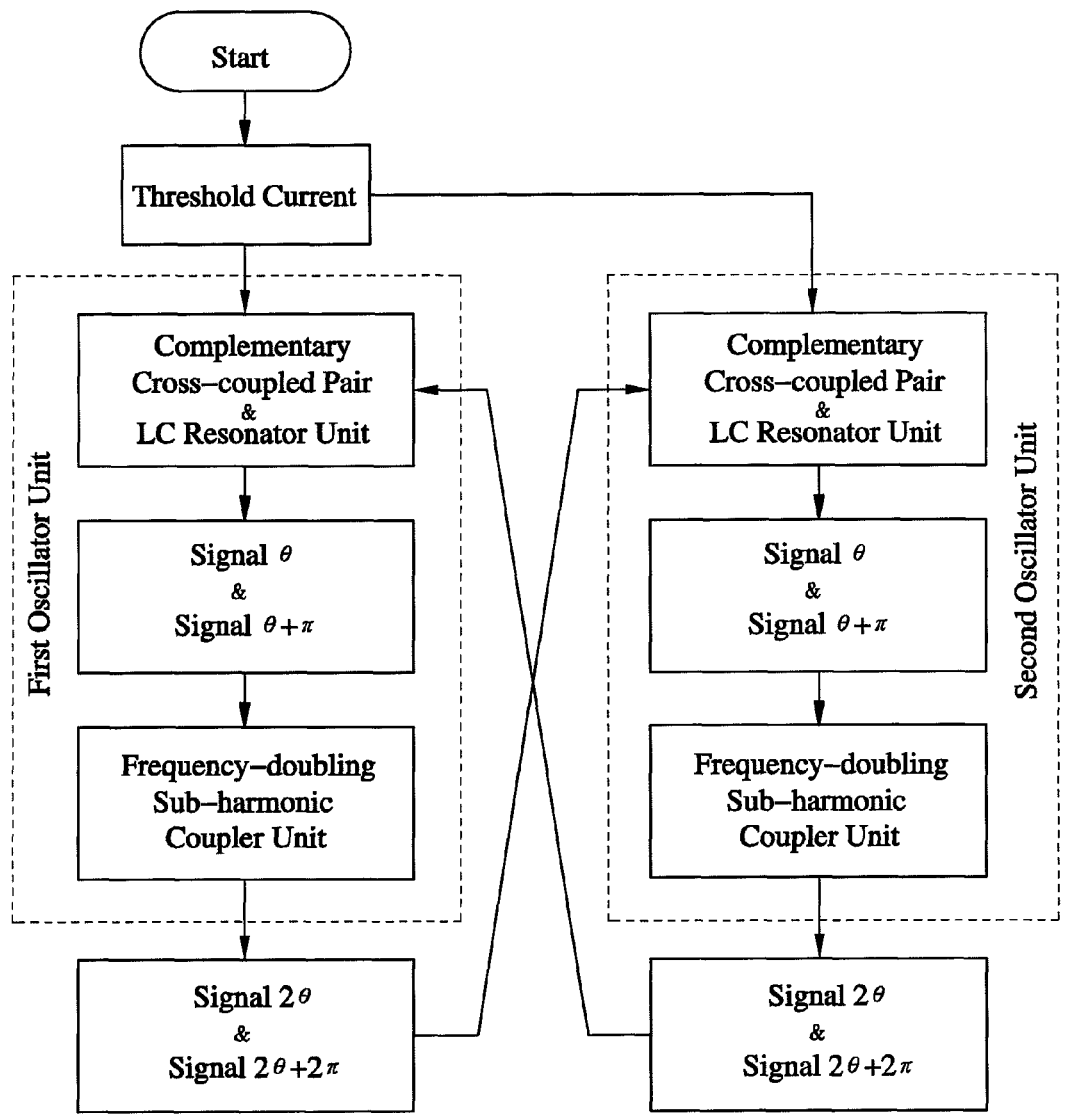
FIG. 3 is another flow chart of the preferred embodiment of the present invention, illustrating the state of the signal in operation.
Figure 4:
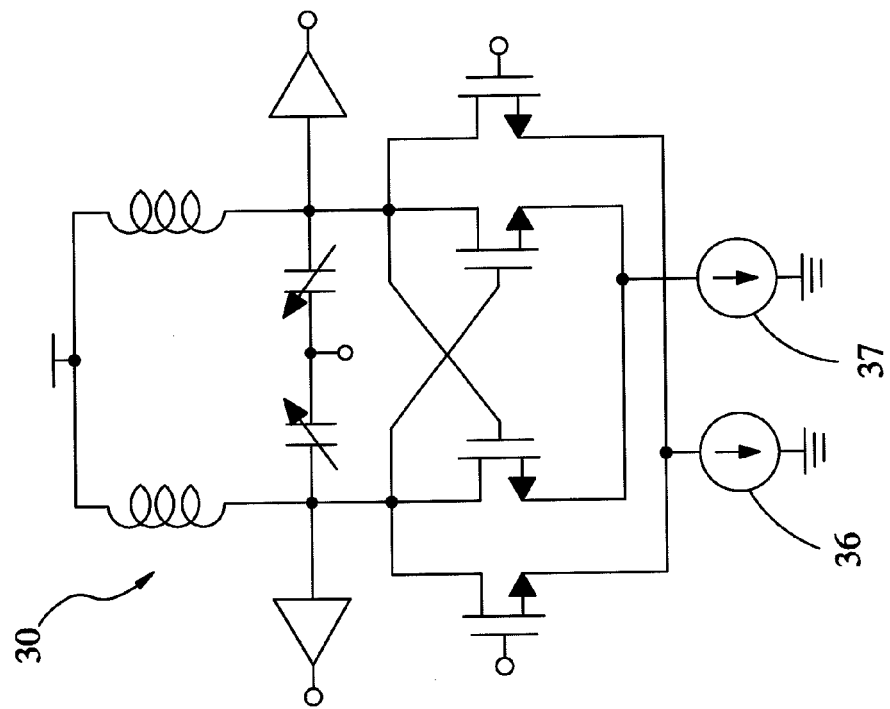
FIG. 4 is a circuit diagram of the first quadrature VCO.
Figure 4:
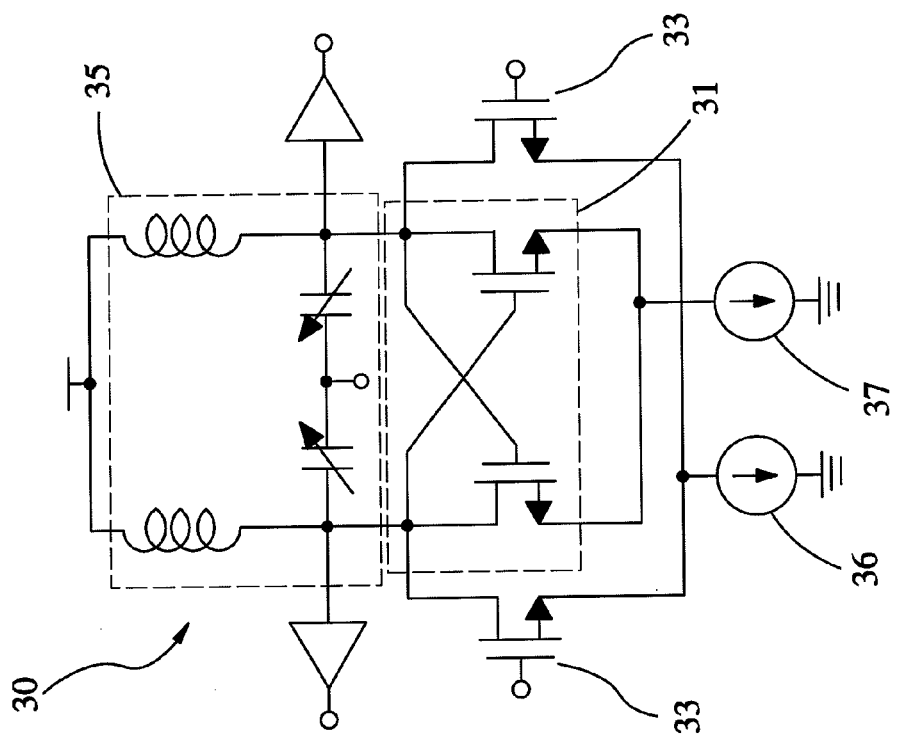
Figure 5:
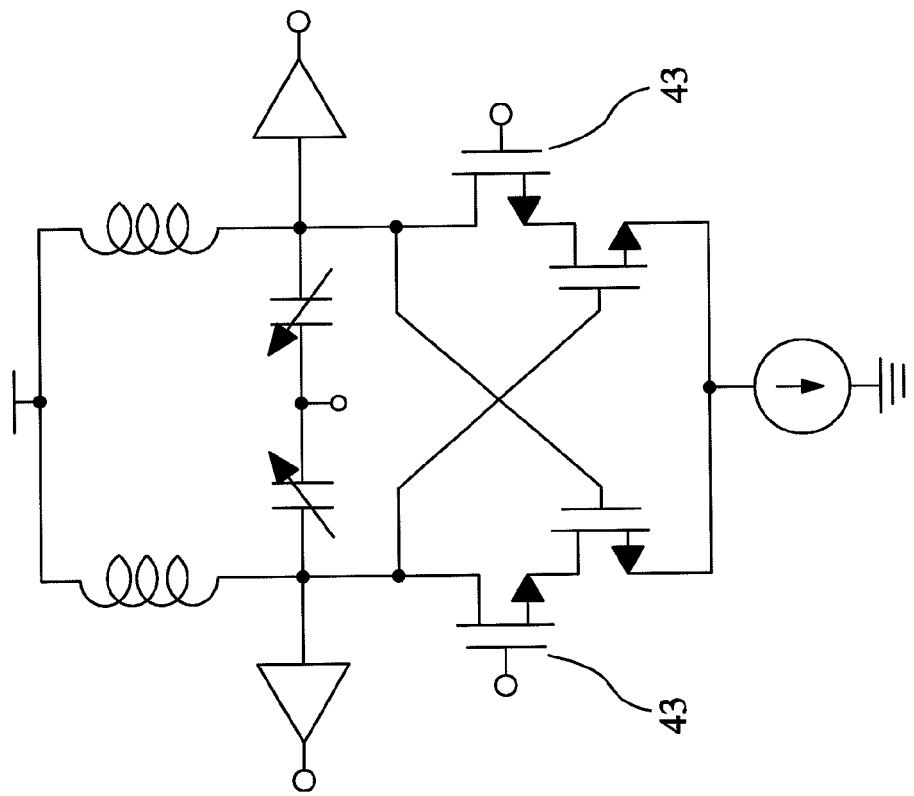
FIG. 5 is a circuit diagram of the second quadrature VCO.
Figure 5:
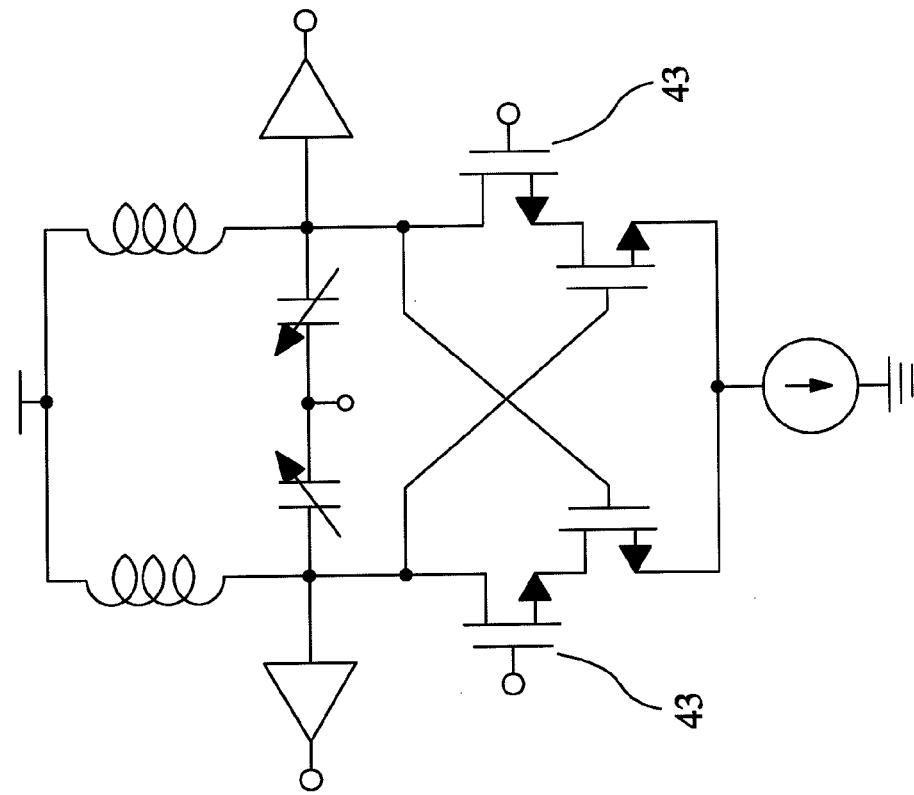
Figure 6:
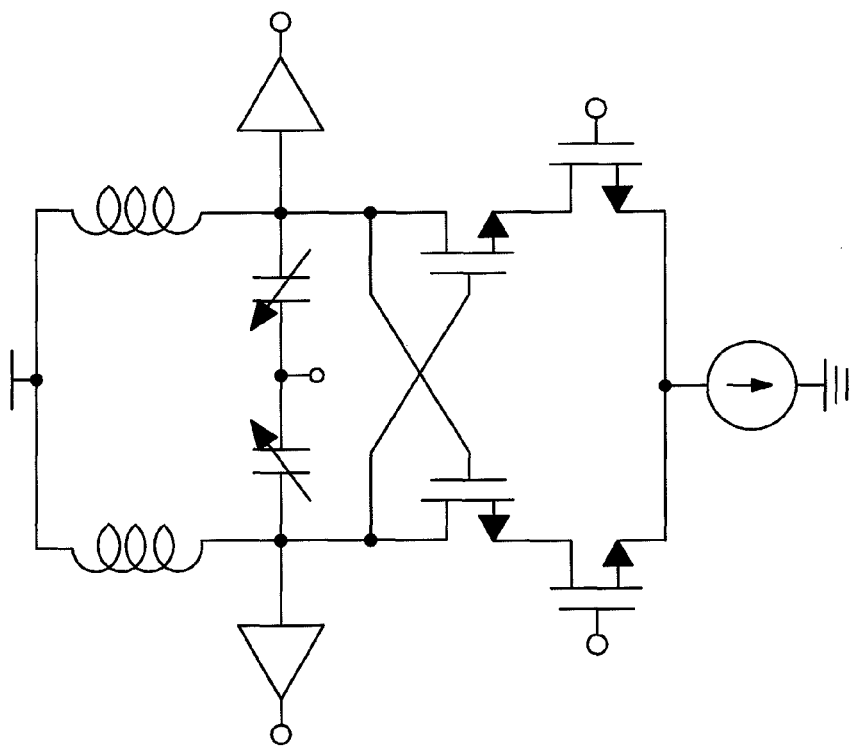
FIG. 6 is a circuit diagram of the third quadrature VCO.
Figure 6:
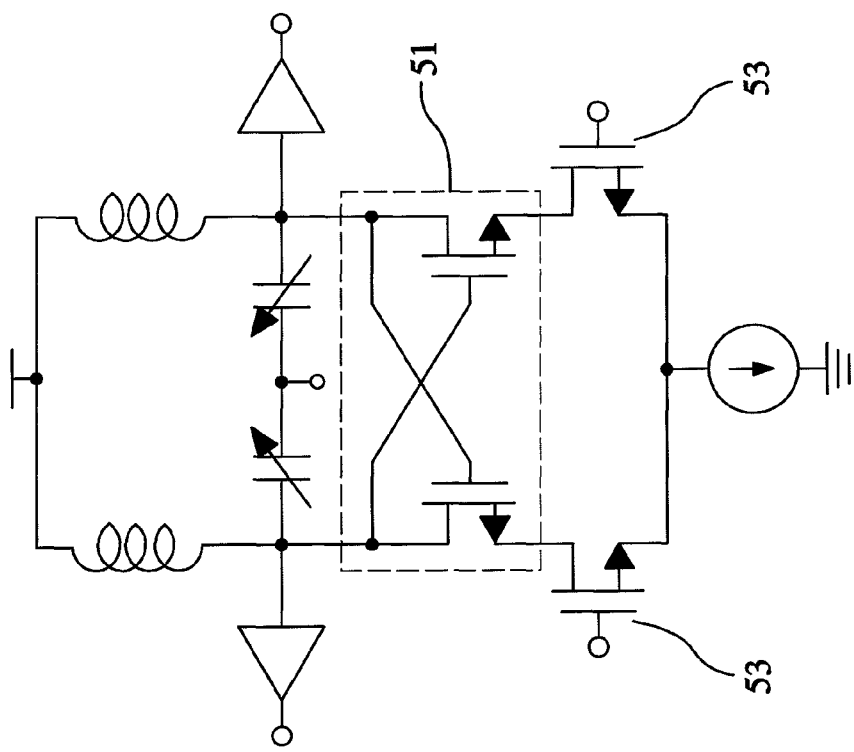
Figure 7:
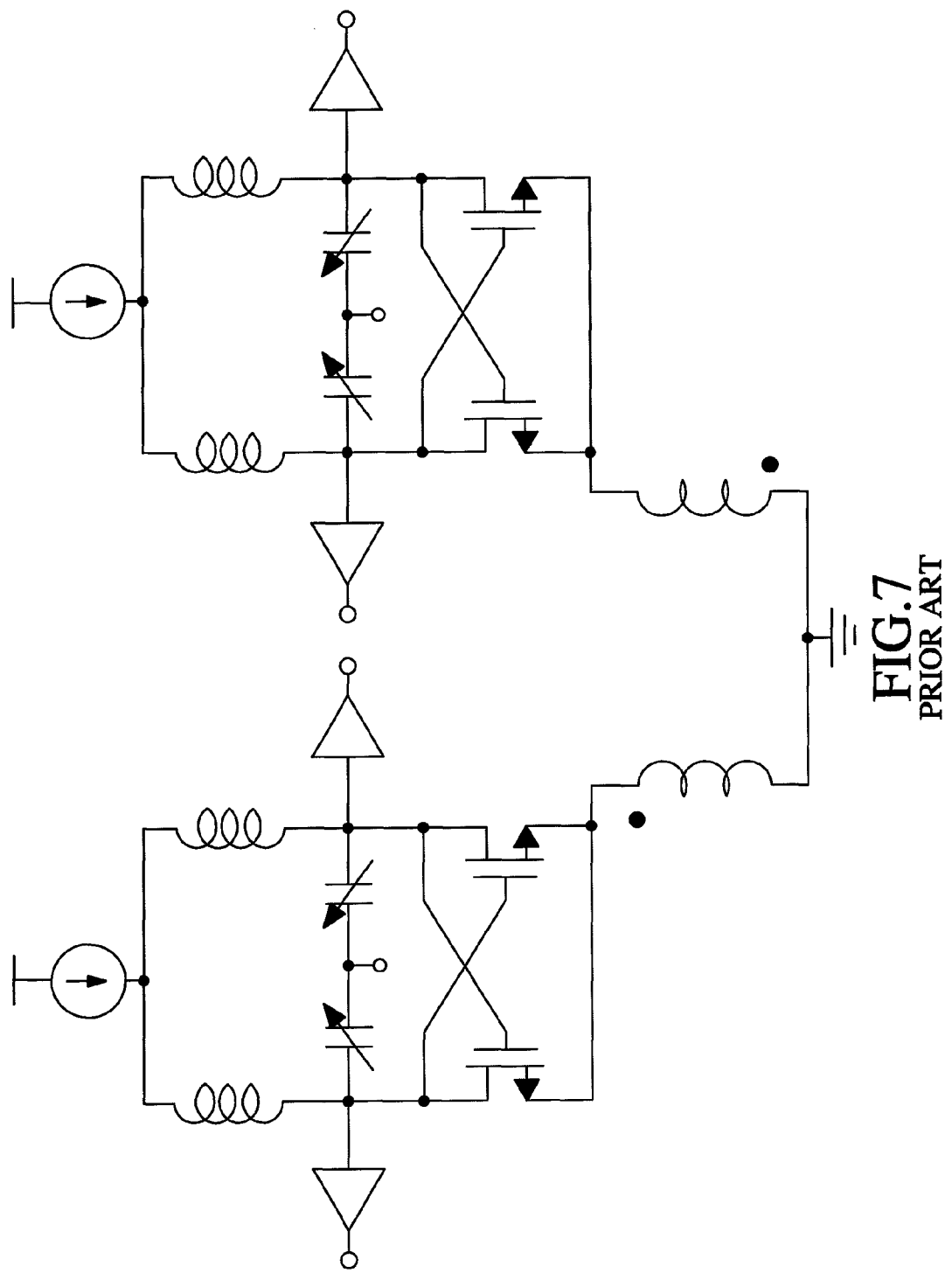
FIG. 7 is a circuit diagram of the fourth quadrature VCO.

Next, referring to FIGS. 1-3, a method of providing quadrature output signals based on the above quadrature VCO in light of the operation of the preferred embodiment of the present invention includes the following steps.

a) Define the two output signals of the first oscillator unit 11 as $\theta$ and $\theta+\pi$, wherein the difference between the two output signals is 180 degrees. Define the two output signals of the second oscillator unit 21 as $\phi$ and $\phi+\pi$, wherein the difference between the two output signals is 180 degrees.

b) Get the two output signals $\theta$ and $\theta+\pi$ of the first oscillator unit 11 and the two output signals $\phi$ and $\phi+\pi$ of the second oscillator unit 21, while the LC resonator unit 16 of the first oscillator unit 11 generates a signal and then the signal is outputted through the corresponding two signal output terminals 161, passes through the frequency-doubling sub-harmonic coupler unit 18, enters the complementary cross-coupled pair 24, and finally injected into the LC resonator unit 26 of the second oscillator unit 21, wherein the difference between the four signals is $\pi/4$. Get the two output signals $\phi$ and $\phi+\pi$ of the second oscillator unit 21 and the two output signals $\theta$ and $\theta+\pi$ of the first oscillator unit 11, when the LC resonator 26 unit of the second oscillator unit 21 generates a signal and then the signal is outputted through the corresponding two output terminals 261, passes through the frequency-doubling sub-harmonic coupler unit 28 of the second oscillator unit 21, enters the complementary cross-coupled pair 14 through the two output terminals 281 of the frequency-doubling sub-harmonic coupler unit 28, enters the complementary cross-coupled pair 14, and further injected into the LC resonator 16 of the first oscillator unit 11, wherein the difference between the four signals is $\pi/4$. The phases of four output signals are quadrature signals of 0°, 90°, 180°, and 270°.

In the step b), the signal generated by the LC resonator unit 16 of the first oscillator unit 11 is a harmonic signal. When the harmonic signal passes through the frequency-doubling sub-harmonic coupler unit 18 of the first oscillator unit 11, a second harmonic signal is generated. After the second harmonic signal is injected into the complementary cross-coupled pair 24 of the second oscillator unit 21, the first harmonic signal of the LC resonator unit 26 of the second oscillator unit 21 itself and the second harmonic signal injected from frequency-doubling sub-harmonic coupler unit 18 of the first oscillator unit 11 are mixed and then a first harmonic signal and a third harmonic signal are generated by the complementary cross-coupled pair 24. Because the LC resonator unit 26 functions as a band-pass filter, the third harmonic signal is filtered out by the LC resonator unit 26 of the second oscillator unit 21 to get a first harmonic signal. Similarly, after the signal generated by the LC resonator unit 26 of the second oscillator unit 21 is injected into the first oscillator unit 11, the signal is filtered out by the LC resonator unit 16 of the first oscillator unit 11 to get a first harmonic signal.

As indicated above, the present invention can keep the output phase difference between the two oscillator units at 180 degrees and make the two oscillator units mutually inject signals to generate quadrature output signals, each of which is a first harmonic quadrature signal and between which the phase difference is 90 degrees.

In addition, the present invention removes the constant current source in the prior art to decrease the influence of the low-frequency noise on the phase noise.

Further, in this embodiment, each of the output terminals 161 and 261 of the first and second oscillator units 11 and 21 can be further connected with a buffer 19(29) and then the signals can be outputted via the buffers 19 and 29. The buffers 19 and 29 can further provide protective and buffering effects and isolate the first and second oscillator units 11 and 21 from the cross talk with the next stage.

Although the present invention has been described with respect to a specific preferred embodiment thereof, it is in no way limited to the specifics of the illustrated structures but changes and modifications may be made within the scope of the appended claims.

What is claimed is:

1. A quadrature VCO comprising:
   a first oscillator unit having a DC bias source, a complementary cross-coupled pair, an LC resonator unit, a frequency-doubling sub-harmonic coupler unit, and a ground terminal; and
   a second oscillator unit having DC bias source, a complementary cross-coupled pair, an LC resonator unit, a frequency-doubling sub-harmonic coupler unit, and a ground terminal;
   wherein the LC resonator unit of the first oscillator unit has two signal output terminals; the frequency-doubling sub-harmonic coupler unit of the first oscillator unit is connected with the two signal output terminals and further has two output terminals coupled with the complementary cross-coupled pair of the second oscillator unit; the LC resonator unit of the second oscillator unit has two signal output terminals; the frequency-doubling sub-harmonic coupler unit of the second oscillator unit is connected with the two signal output terminals of the second oscillator unit and further has two output terminals coupled with the complementary cross-coupled pair of the first oscillator unit;
   wherein when the LC resonator units of the first and second oscillator units are operated, signals of quadrature phases are outputted via the signal output terminals.

2. The quadrature VCO as defined in claim 1, wherein each of the frequency-doubling sub-harmonic coupler units is comprised of two N-type transistors whose gate nodes are coupled with the two signal output terminals of the corresponding one of the first and second oscillator units; the phase difference between the output signals of the two signal output terminals of the first oscillator unit is 180 degrees; the phase difference between the output signals of the two signal output terminals of the second oscillator unit is 180 degrees; drain nodes of the two N-type transistors of the frequency-doubling sub-harmonic coupler unit of the first oscillator unit are connected with each other to become one of the output terminals to be coupled with the DC bias source; source nodes of the two N-type transistors of the frequency-doubling sub-harmonic coupler unit of the first oscillator unit are connected with each other to become one of the output terminals to be coupled with the ground terminal of the second oscillator unit; the drain nodes of the two N-type transistors of the frequency-doubling sub-harmonic coupler unit of the second oscillator unit are connected with each other to become one of the output terminals to be coupled with the DC bias source of the first oscillator unit; the source nodes of the two N-type transistors of the frequency-doubling sub-harmonic coupler unit of the second oscillator unit are connected with each other to become one of the output terminals to be coupled with the ground terminal of the first oscillator unit.

3. The quadrature VCO as defined in claim 2, wherein each of the complementary cross-coupled pairs comprises an N-type transistor cross-coupled pair and a P-type transistor cross-coupled pair, each of the N-type transistor cross-coupled pair having two N-type transistors, one of which is the first N-type transistor and the other is the second N-type transistor, a gate node of the first N-type transistor being coupled with a drain node of the second N-type transistor, a gate node of the second N-type transistor being coupled with a drain node of the first N-type transistor, the drain nodes of the first and second N-type transistors being coupled with the gate nodes of the two N-type transistors of the frequency-doubling sub-harmonic coupler unit of the corresponding first or second oscillator unit, the source nodes of the first and second N-type transistors being coupled with the ground terminal of the corresponding first or second oscillator unit;

each of the P-type transistor cross-coupled pairs having two P-type transistors, one of which is the first P-type transistor and the other is the second P-type transistor, a gate node of the first P-type transistor being coupled with a drain node of the second P-type transistor, a gate node of the second P-type transistor being coupled with a drain node of the first P-type transistor, the drain nodes of the first and second P-type transistors being coupled with the gate nodes of the two N-type transistors of the frequency-doubling sub-harmonic coupler unit of the corresponding first or second oscillator unit, source nodes of the first and second P-type transistors being coupled with the DC bias source of the corresponding first or second oscillator unit.

4. The quadrature VCO as defined in claim 3, wherein each of the LC resonator units comprises an inductor module and a capacitor module, the indictor module having an inductor whose two ends are connected with the drain nodes of the two P-type transistors of the P-type transistor cross-coupled pair of the corresponding first or second oscillator unit, respectively, the capacitor module having two varactor diodes, whose negative electrodes are coupled with the drain nodes of the two P-type transistors of the P-type transistor cross-coupled pair of the corresponding first or second oscillator unit, respectively, and whose positive electrodes are coupled with a voltage-controlled power terminal, which is adapted for externally controllably changing the capacitance of the capacitor module.

5. The quadrature VCO as defined in claim 2 further comprising four buffers, which are connected with the signal output terminals of the first and second oscillator units, respectively.

6. The quadrature VCO as defined in claim 1, wherein the four signals outputted from the signal output terminals of the first and second oscillator units are quadrature signals of 0°, 90°, 180°, and 270°, respectively.

\* \* \* \* \*